United States Patent
Torihata et al.

[11] Patent Number: 6,145,651
[45] Date of Patent: Nov. 14, 2000

[54] GUIDE RAIL MECHANISM FOR A BONDING APPARATUS

[75] Inventors: Minoru Torihata, Musashimurayama; Shinji Maki, Fussa, both of Japan

[73] Assignee: Kabushiki Kaisha Shinkawa, Tokyo, Japan

[21] Appl. No.: 09/282,886

[22] Filed: Mar. 31, 1999

[30] Foreign Application Priority Data

Mar. 31, 1998 [JP] Japan ................................ 10-103980

[51] Int. Cl.⁷ .................................................. B65G 19/18
[52] U.S. Cl. ...................... 198/735.3; 198/741; 193/38; 193/15
[58] Field of Search .................... 198/740, 741, 198/735.3; 193/38, 15

[56] References Cited

U.S. PATENT DOCUMENTS

| | | | |
|---|---|---|---|
| 3,854,688 | 12/1974 | Shufort | 248/316 |
| 3,974,904 | 8/1976 | Morton | 193/38 |
| 5,823,316 | 10/1998 | Shaw et al. | 198/341 |
| 5,937,992 | 8/1999 | Davis et al. | 198/341.01 |

FOREIGN PATENT DOCUMENTS

| | | | |
|---|---|---|---|
| 55-26696 | 2/1980 | Japan | 420/421 |
| 60-63935 | 4/1985 | Japan | 167/168 |
| 63-56121 | 11/1988 | Japan . | |

*Primary Examiner*—Christopher P. Ellis
*Assistant Examiner*—Rashmi Sharma
*Attorney, Agent, or Firm*—Koda & Androlia

[57] ABSTRACT

A guide rail mechanism for a bonding apparatus for transferring a workpiece such as a lead frame, etc. including a pair of guide rails each comprising an edge surface guide rail element for guiding the edge surface of the workpiece and an undersurface guide rail element disposed beneath the edge surface guide rail element so as to support the undersurface of the edge portion of the workpiece. A driver for the undersurface guide rail element comprised of a rotational shaft with an eccentric cam portion and other parts is installed so as to move the undersurface guide rail element, thus changing the positional relationship between the edge surface guide rail element and the undersurface guide rail element for workpieces of different thicknesses.

6 Claims, 6 Drawing Sheets

GUIDE RAIL MECHANISM FOR A BONDING APPARATUS

BACKGROUND OF THE INVENTION

1. Field of the Invention

The present invention relates to a guide rail mechanism for a bonding apparatus.

2. Prior Art

Figure 9:
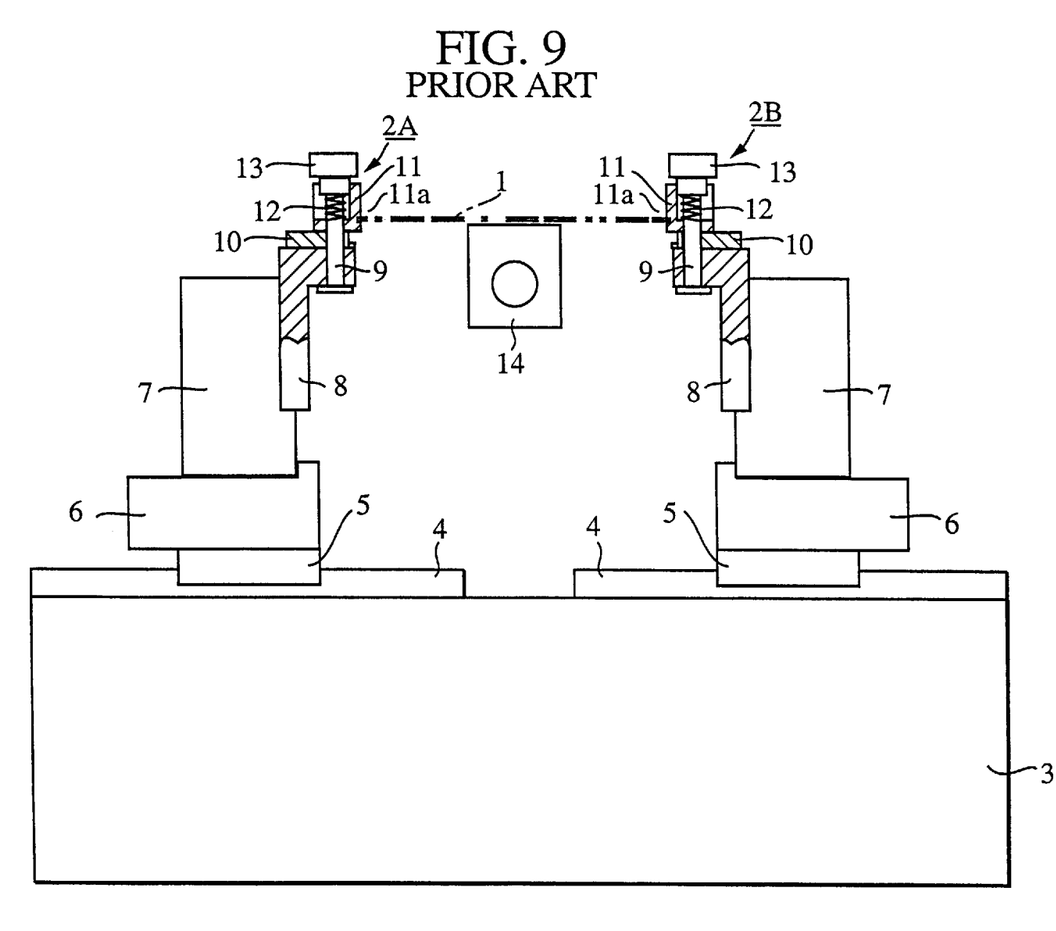
FIG. 9 is a partially sectional side view of a conventional guide rail mechanism for a bonding apparatus.
Figure 10:
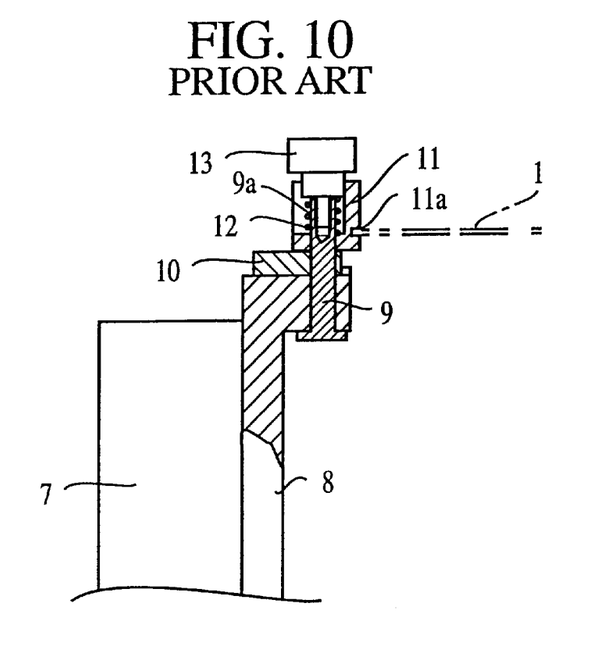
FIG. 10 is an enlarged sectional view of the essential portion in FIG. 9.

Conventionally, the guide rail mechanisms used in bonding apparatuses such as die bonding apparatuses and wire bonding apparatuses, etc. include, as shown in FIGS. 9 and 10, a pair of guide rail sections 2A and 2B which guide both sides of a workpiece such as a lead frame 1. Since these guide rail sections 2A and 2B have more or less the same structures, the same or corresponding members will be described using the same reference numerals.

A pair of width adjustment guides 4 which extend in the direction of width of a lead frame 1 being conveyed are disposed on the upper surface of a stand 3, and a slider 5 which is moved by a driving means (not shown) is slidably disposed on each of the width adjustment guides 4. Here, the "direction of width" and "inside" of the lead frame 1 are indicated relative to the direction of the position of the heating block 14 (described later) which is located substantially in the central portion of a guide rail stand 8 (also described later) as shown in FIG. 9. A sliding block 6 is provided on the slider 5, and a supporting block 7 is fastened to the sliding block 6; in addition, a guide rail stand 8 is fastened to the inside surface of the supporting block 7.

A screw shaft 9, which extends vertically upward and is provided with an internal thread 9a formed in its upper end part, is fastened to each of the guide rail stands 8. A rail height adjustment spacer 10, which is inserted into the screw shaft 9, and a frame guide rail 11 are provided on the surface of each guide rail stand 8. Furthermore, a spring 12 is mounted on a portion of the screw shaft 9 on each frame guide rail 11, and a bolt 13 is tightened in the internal thread 9a of the screw shaft 9, so that the rail height adjustment spacer 10 and frame guide rail 11 are fastened in place by being pressed against the guide rail stand 8 by the spring 12. Furthermore, a heating block 14 which heats the lead frame 1 is disposed between the frame guide rails 11. This heating block 14 is raised and lowered by a driving means (not shown).

Guide rail mechanisms of this type are described in, for example, Japanese Patent Application Laid-Open (Kokai) Nos. S55-26696 and S60-63935 and Japanese Patent Application Publication (Kokoku) No. 63-56121.

In the above prior art, the lead frame 1 is fed along the guide sections 11a of the frame guide rails 11 to the bonding position by a feeding claw (not shown). Following positioning, bonding is performed by a bonding apparatus (not shown) to the lead frame 1. In a die bonding apparatus, semiconductor pellets are bonded to the surface of the lead frame 1; while in a wire bonding apparatus, wires are connected between leads of the lead frame 1 and pads on the semiconductor pellets are bonded to the surface of the lead frame 1.

Thus, in bonding apparatuses, semiconductor pellets are bonded to the surfaces of lead frames, or wires are connected between the leads of such lead frames and the pads of semiconductor pellets. In this case, the upper surface of the lead frame act as a reference surface at the height position during bonding. Accordingly, if the thickens of the lead frame changes as a result of a change in the type of workpiece (lead frame, for instance) to be handled, e. g., in cases where the workpiece to be handled is thicker than a previous workpiece that has been handled, the height of the upper surface of the lead frame, i. e., the upper surface of the reference surface, is heightened; and as a result, the frame guide rails 11 must be lowered so as to compensate the difference in thickness, thus keeping the height of the reference surface at a constant value.

More specifically, it is necessary to change the rail height adjustment spacers 10 which have a thickness suited to the thickness of the lead frame to be handled. The rail height adjustment spacers 10 are changed as follows: the bolts 13 are loosened and removed from the screw shafts 9, the frame guide rails 11 and rail height adjustment spacers 10 are removed, new rail height adjustment spacers 10 are installed, the rail height adjustment spacers 10 and frame guide rails 11 are put back, and then the bolts 13 are tightened back in the screw shafts 9.

Figure 11:
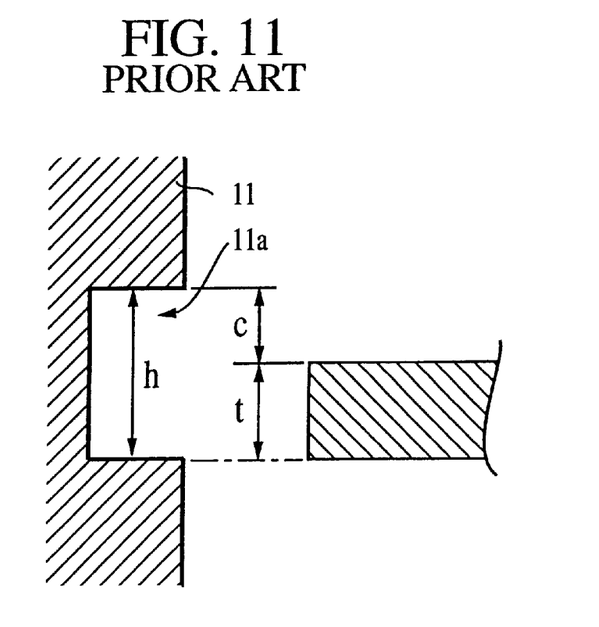
FIG. 11 is an explanatory diagram illustrating the relationship between a lead frame and a guide section of the guide rails.

Especially in cases where the guide sections 11a of the frame guide rails 11 are angled C-shaped ("[") rails and angled reverse-C-shaped ("]") rails as shown in FIGS. 9 through 11, it has conventionally been necessary to replace the frame guide rails 11 entirely if the thickness t of the lead frame 1 changes greatly. Ordinarily, the thickness t, as seen in FIG. 11, of a lead frame is in the range of 0.1 to 0.4 mm. Accordingly, the height h of the guide sections 11a of the frame guide rails 11 is obtained by adding a clearance c to the thickness t of the lead frame 1 so that lead frame 1 can be conveyed. Consequently, in cases where the thickness t of the lead frame 1 is within the height h of the guide sections 11a, it is necessary to replace only the rail height adjustment spacers 10, even if the thickness t of the lead frame 1 should vary. However, in cases where the thickness t of the changed lead frame 1 exceeds the height h of the guide sections 11a, the frame guide rails 11 must be replaced with frame guide rails 11 that are suited to the changed lead frame 1.

In the above prior art, in cases where the thickness t of the lead frame 1 changes as a result of a change in the type of workpiece to be handled, it is necessary to loosen and remove the bolts 13, replace the rail height adjustment spacers 10, and then put the bolts 13 back and tighten them. In addition, the pair of frame guide rails 11 are installed so as to extend in the direction in which the lead frame 1 is conveyed; accordingly, each one of the guide rail sections 2A and 2B is provided with two screw shafts 9 along the conveying direction of the lead frame 1, and springs 12 are mounted on the respective screw shafts 9 so that bolts 13 press the frame guide rails 11 and rail height adjustment spacers 10 against the guide rail stands 8 via the spring 12. In other words, each of the guide rails 11 have two screw shafts 9, two screws 12, two bolts 13, etc. As a result, when a lead frame of a different thickness is to be handled, four bolts 13 are loosened and removed, the rails 11 are adjusted for the lead frame to be handled, and then the bolts 13 are remounted and re-tightened. Thus, it requires a long time for adjustment, resulting in a drop in productivity.

Furthermore, a plurality of rail height adjustment spacers 10 with different thicknesses that match the thickness of the changed lead frame must be prepared so as to be used. This creates problems in terms of the control and storage of the spacers 10; moreover, equipment costs are increased. In the case of frame guide rails 11 which have guide sections 11a of the type shown in FIGS. 9 and 10, a plurality of sets of frame guide rails 11 must be prepared. This causes the equipment cost to increase.

SUMMARY OF THE INVENTION

Accordingly, the first object of the present invention is to provide a guide rail mechanism for a bonding apparatus in which the adjustment of the height of the frame guide rails in response to a change in the type (thickness) of a workpiece to be handled can be performed in a short time, improving the productivity.

The second object of the present invention is to provide a guide rail mechanism for a bonding apparatus in which the cost of the equipment required for each change in the type of workpiece to be handled can be reduced.

The first and second objects are accomplished by a unique structure for a guide rail mechanism for a bonding apparatus that includes a pair of guide rails for guiding a workpiece such as a lead frame and the like; and in the present invention each of the guide rails comprises an edge surface guide rail element, which is installed in a guide rail stand and guides the edge surface of a workpiece, and an undersurface guide rail element, which is disposed beneath the edge surface guide rail element and supports the undersurface of the edge portion of a workpiece; and in addition, an undersurface guide rail element driving means is provided so as to raise and lower the undersurface guide rail element.

In the above-described structure, the edge surface guide rail element, which is provided on the guide rail stand and guides the edge surface of the workpiece, may be formed so as to open upward.

Furthermore, in the above structure, the undersurface guide rail element driving means is comprised of a rotational shaft and a rotational driving means, in which the rotational shaft consists of a shaft portion which is rotatably disposed on a guide rail stand and a cam portion which is provided at the end of the shaft portion and supports, raises and lowers the undersurface guide rail element; and the rotational driving means is, for instance, a motor which rotationally drives the rotational shaft.

Such an undersurface guide rail element driving means may further include a control device that controls the amount of driving of the rotational driving means (a motor) or may further include a rotational shaft positioning means that holds the rotational shaft in a plurality of stopping positions.

BRIEF DESCRIPTION OF THE DRAWINGS

FIG. 2 shows the essential portion of FIG. 1, wherein FIG. 2(*a*) is an enlarged sectional view guiding a lead frame of a large thickness, and FIG. 2(*b*) is an enlarged sectional view guiding a lead frame of a small thickness;

FIG. 4 shows the essential portion of the second embodiment of the present invention, wherein FIG. 4(*a*) is an enlarged sectional view guiding a lead frame of a large thickness, and FIG. 4(*b*) is an enlarged sectional view guiding a lead frame of a small thickness;

DETAILED DESCRIPTION OF THE PREFERRED EMBODIMENTS

Figure 1:
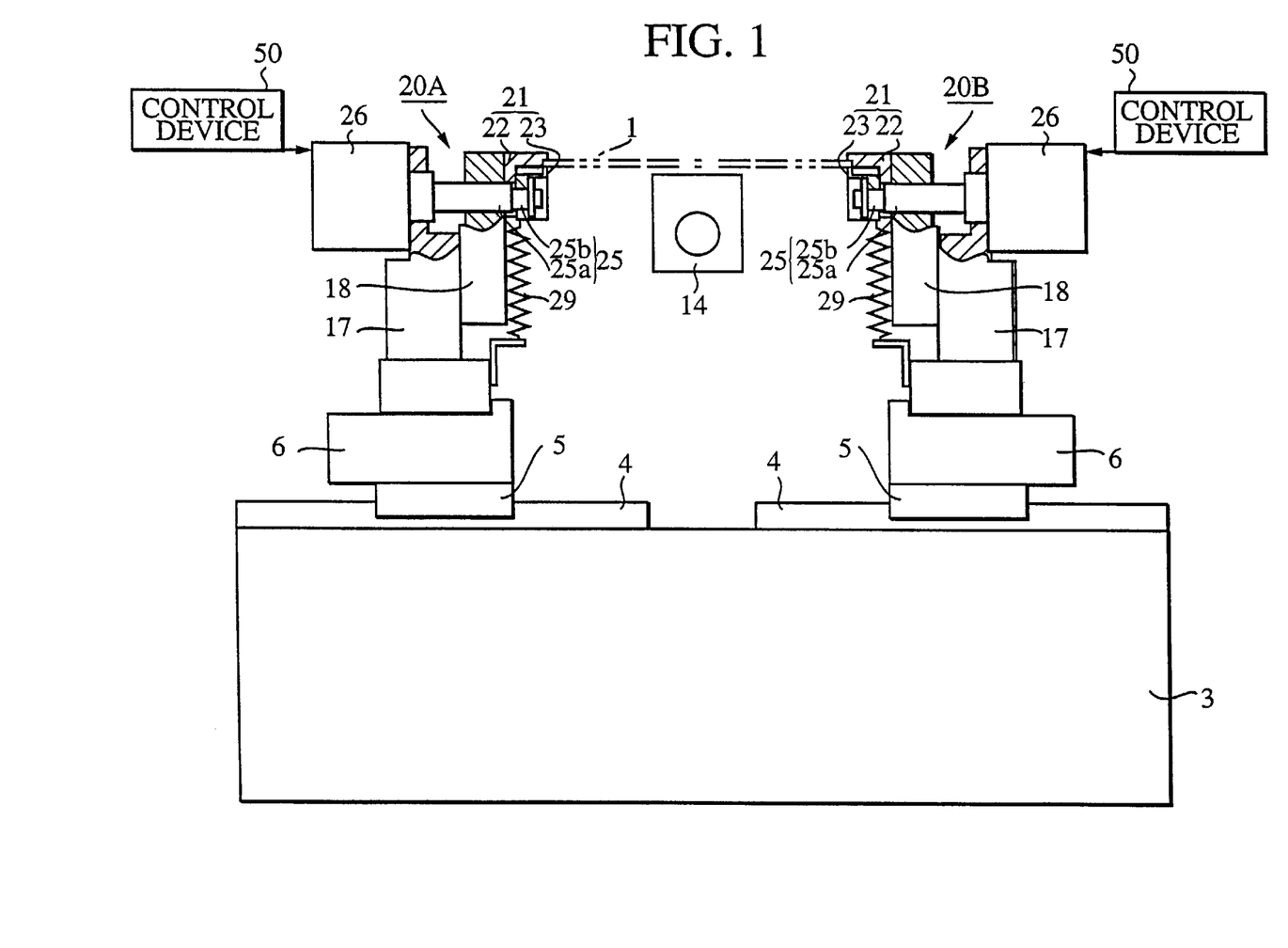
FIG. 1 is a partially sectional side view of a first embodiment of the guide rail mechanism for a bonding apparatus according to the present invention.
Figures 2A, 2B:
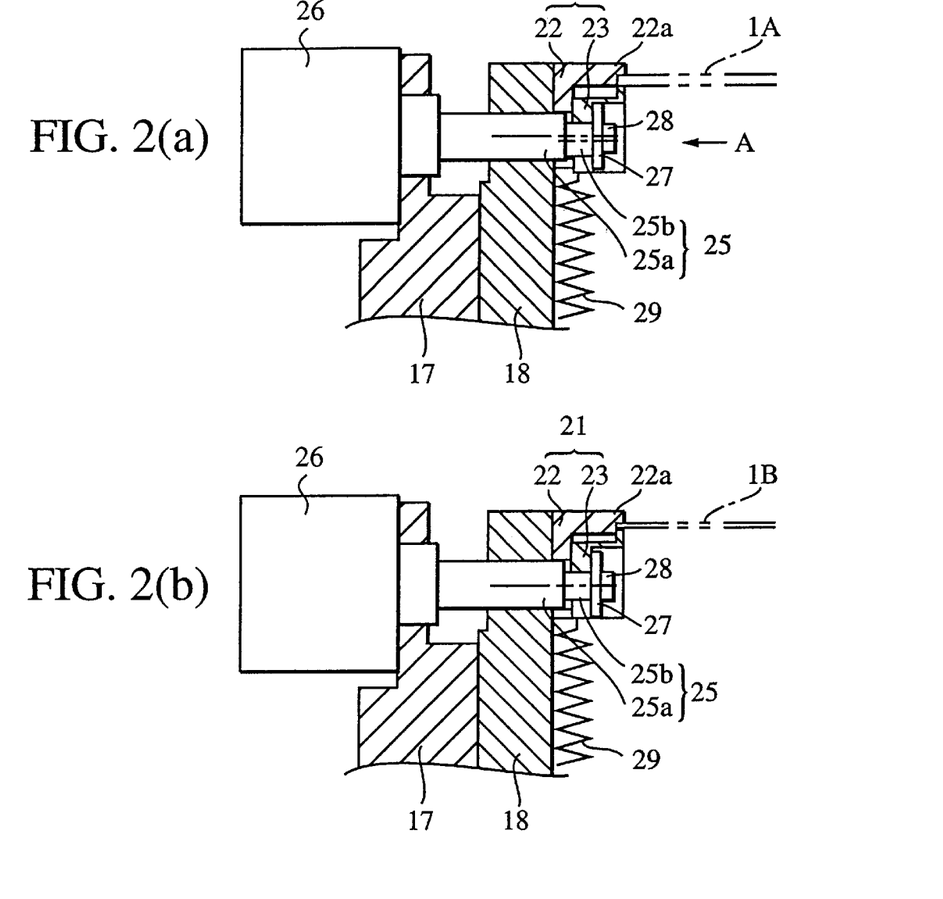
Figure 3:
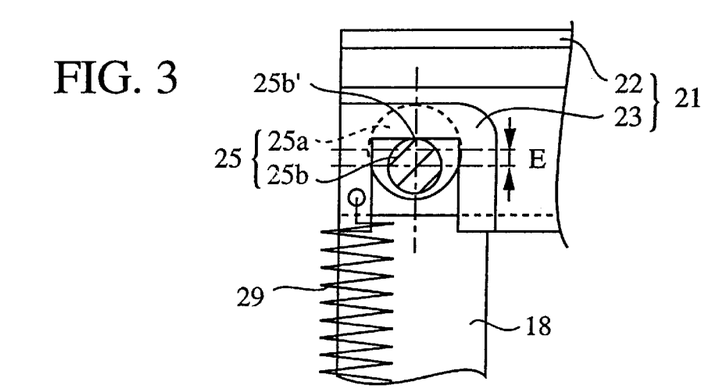
FIG. 3 is a view taken in the direction of arrow 3 in FIG. 2(*a*), showing the cam portion.

The first embodiment of the present invention will be described with reference to FIGS. 1 through 3.

As in a conventional mechanism, a pair of width adjustment guides 4 which extend in the direction of width of a lead frame 1 being conveyed are disposed on the upper surface of a stand 3, and sliders 5 which are moved by a driving means (not shown) are slidably disposed on these width adjustment guides 4. A sliding block 6 is fastened to each slider 5, a supporting block 17 is fastened to this sliding block 6, and a guide rail stand 18 is provided on the inner surface of this supporting block 17.

Each of the guide rails 21 of the guide rail sections 20A and 20B comprises an edge surface guide rail element 22 which guides the edge surface of the lead frame 1, and an undersurface guide rail element 23 which supports the undersurface of the lead frame 1. The edge surface guide rail elements 22 are fastened to the inside surfaces of the guide rail stands 18; and the undersurface guide rail elements 23 are raised and lowered by an undersurface guide rail element driving means which raises and lowers the undersurface guide rail element and will be described below.

Rotational shafts 25, each of which comprises a shaft portion 25*a* and a cam portion 25*b*, are inserted into the guide rail stands 18 at the shaft portions 25*a* so that the rotational shafts 25 can be rotated. As best seen in FIG. 3, the cam portion 25*b* of each of the rotational shafts 25 is offset by eccentricity E from the shaft portion 25*a*. A motor 26 is installed on each of the supporting block 17, and the output shaft of the motor 26 is coupled to the outside end of each shaft portion 25*a*. The undersurface guide rail element 23 is placed on the cam portion 25*b*, and a retaining plate 27 is fastened to the end surface of the cam portion 25*b* by a screw 28. Here, the portion of the undersurface guide rail element 23 that corresponds to and faces the cam portion 25*b* of each rotational shaft 25 is inserted into a space between the edge surface guide rail element 22 and the retaining plate 27. Furthermore, a spring 29 is provided between the undersurface guide rail element 23 and the supporting block 7 so that the undersurface guide rail element 23 is pressed against the cam portion 25*b* by the spring 29.

Next, the operation will be described with reference to FIG. 2. In FIG. 2(*a*), a thick lead frame 1A is conveyed, while in FIG. 2(*b*) a thin lead frame 1B is conveyed.

When the motors 26 (only one of the two is shown) are driven and the rotational shafts 25 are rotated, the height of the upper surfaces 25*b*' of the cam portions 25*b* (which are eccentric shafts offset from the centers of the shaft portions 25*a*) changes, and the undersurface guide rail elements 23 are raised or lowered, thus changing the distance between the edge surface guide rail element 22 and the undersurface guide rail elements 23.

Accordingly, when the type of workpiece (lead frame) to be handled is changed from a thick lead frame 1A shown in FIG. 2(*a*) to a thin lead frame 1B shown in FIG. 2(*b*), the motors 26 are driven so that the undersurface guide rail elements 23 are raised by an amount that corresponds to the difference in thickness and so that the upper surface of the thin lead frame 1B is positioned at the same height level as the upper surface of the thick lead frame 1A. Reversely, when the type of workpiece (lead frame) to be handled is changed from a thin lead frame 1B shown in FIG. 2(b) to a thick lead frame 1A shown in FIG. 2(a), the motors 26 are driven in reverse so that the undersurface guide rail elements 23 are lowered by an amount that corresponds to the difference in thickness and so that the upper surface of the thick lead frame 1A is positioned at the same height level as the upper surface of the thin lead frame 1B.

Thus, the height of the undersurface guide rail elements 23 are adjusted in accordance with the thickness of the workpiece to be handed merely by driving the motors 26. Accordingly, the height of the undersurface guide rail elements 23 can be adjusted in a short time, and the productivity is improved.

Such effect can be further enhanced by linking a control device 50 to the motors 26. In other words, an instant response to the changes in the type (or thickness) of workpiece to be handled can be accomplished by inputting in advance the relationships of the type of lead frame 1, amount of driving of the motors 26 and stopping positions of the cam portions 25b into the control device 50 so that the control device controls the motors 26 accordingly.

In addition, since there is no need in the present invention for rail height adjustment spacers 10 (see FIGS. 9 and 10) used for each type of workpiece in the conventional devices, the equipment costs can be reduced.

Figure 4A:
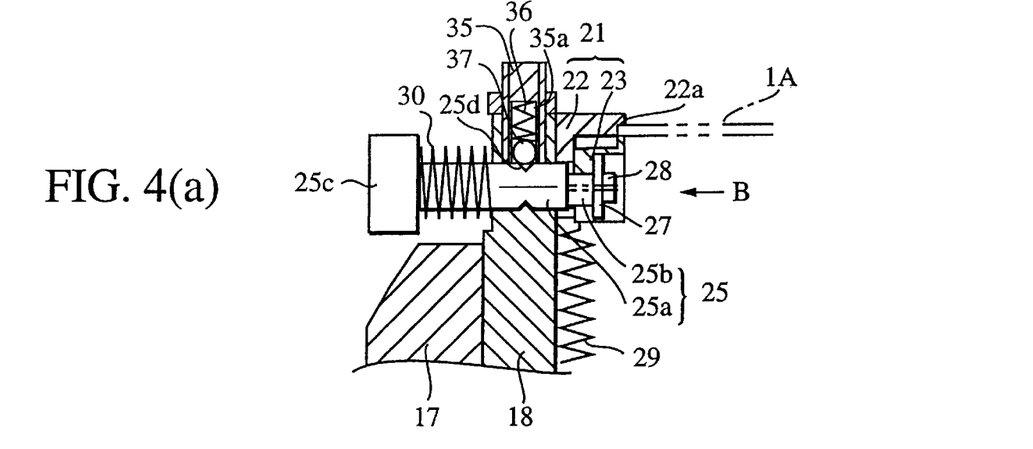
Figure 4B:
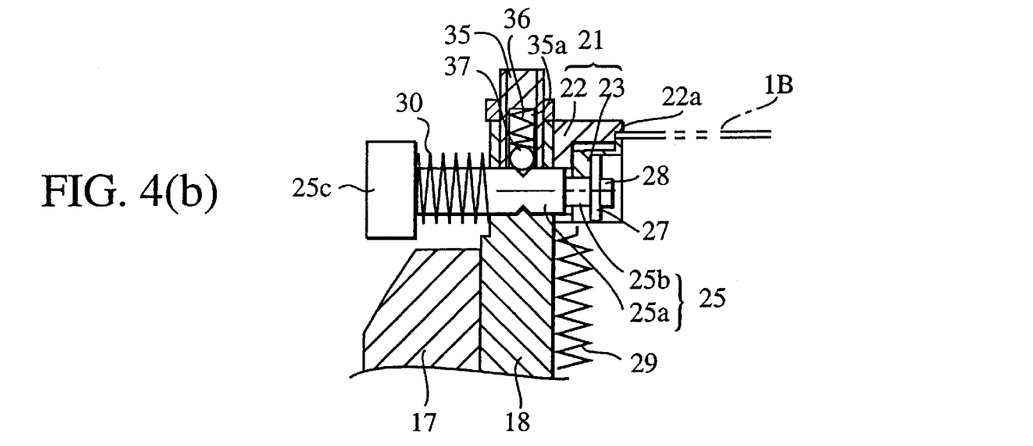
Figure 5:
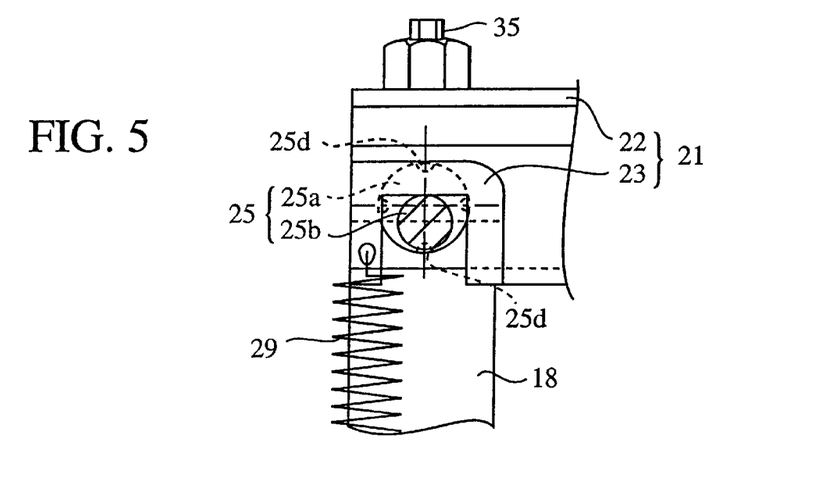
FIG. 5 is a view taken in the direction of arrow 5 in FIG. 4(*a*), showing the cam portion.

FIGS. 4 and 5 illustrate a second embodiment of the present invention. Though the rotational shafts 25 are rotated by the motors 26 in the first embodiment, the rotational shafts 25 in the second embodiment are rotated by hand. Constituting elements which are the same as in the first embodiment of FIGS. 1 through 3 or which correspond to those in FIGS. 1 through 3 are labeled with the same reference numerals, and a description of such is omitted.

A knob 25c, instead of the motor 26, is disposed on the outside end of each one of the rotational shafts 25, and a spring 30 is mounted on the shaft portion 25a of the rotational shaft 25 so that the spring 30 is between the guide rail stand 18 and knob 25c. Furthermore, a rotational shaft positioning means which holds the rotational shaft 25 in a plurality of rotational positions (four positions in the case illustrated embodiment) is disposed on the rotational shaft 25 and guide rail stand 18. More specifically, four notch holes 25d are formed in the outer surface of the rotational shaft 25, a screw 35 is screwed into the guide rail stand 18 so as to positionally correspond to the notch holes 25d, a spring accommodating hole 35a is formed in the lower end of the screw 35, a spring 36 is installed in the spring accommodating hole 35a, and a ball 37 is provided at the end of the spring 36 so as to face the notch holes 25d.

Accordingly, in this second embodiment, when the knobs 25c (only one of the two is shown) are turned by hand, the rotational shafts 25 are rotated; as a result, the height positions of the upper surfaces of the cam portions 25b are changed so that the undersurface guide rail elements 23 are raised or lowered. When, by the spring 36, the ball 37 engages one of the notch holes 25d as a result of the turning of the shaft portions 25a of the rotational shafts 25, the rotational shaft 25 is held in that position. Thus, by forming four notch holes 25d in positions corresponding to the positions of the cam portions 25b for four different types (in thickness) of workpieces, the upper surface of the lead frame 1 (thick lead frame 1A of thin lead frame 1B) can be adjusted to a constant height level as in the first embodiment.

In the second embodiment, four notch holes 25d are formed; however, there is no restriction on the number of notch holes 25d formed. It goes without saying, though, that the differences in the thickness of the workpieces or lead frames are limited to the number of notch holes 25d. Furthermore, the positional holding of the rotational shafts 25 is not limited to the described notch hole and ball combination.

Figure 6:
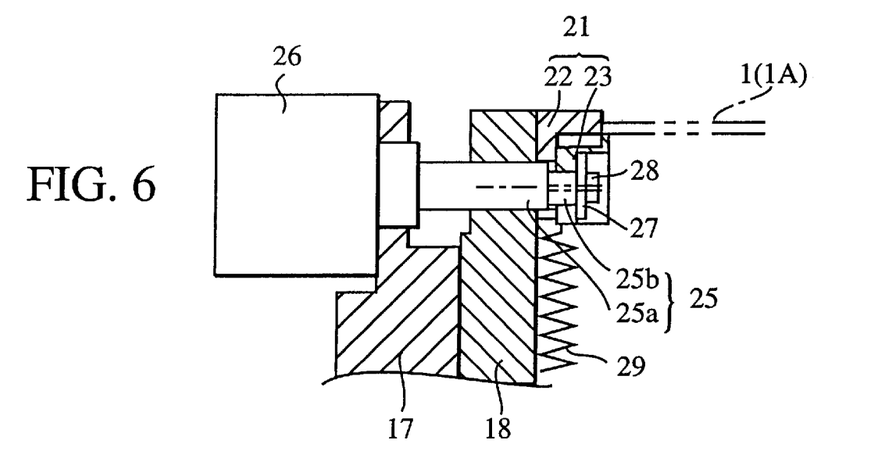
FIG. 6 shows the essential portion of the third embodiment of the present invention.
Figure 7:
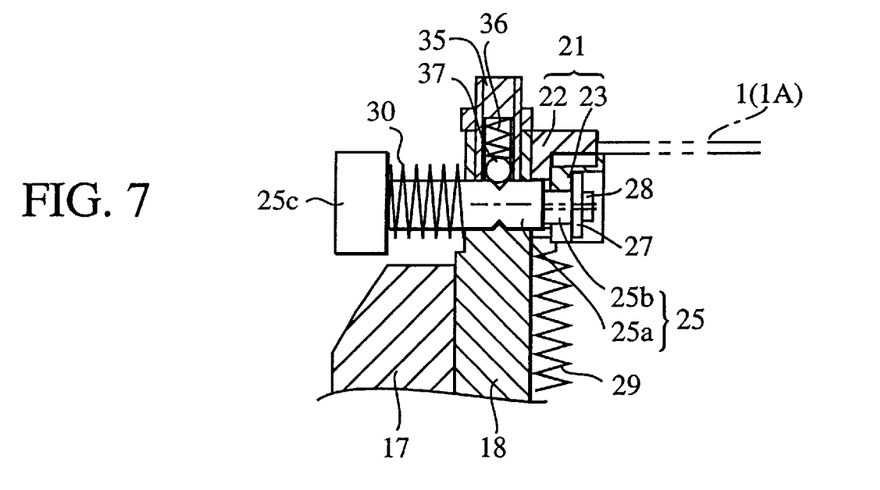
FIG. 7 shows the essential portion of the fourth embodiment of the present invention.

FIGS. 6 and 7 illustrate third and fourth embodiments of the present invention. FIG. 6 corresponds to FIG. 2, and FIG. 7 corresponds to FIG. 4.

Incidentally, guide rails come in many different types, including rails which have angled C-shaped ("[") and angled reverse-C-shaped ("]") guide sections and rails which have guide sections whose upper surfaces are open. For instance, Japanese Patent Application Laid-Open (Kokai) No. S60-63935, Japanese Patent Application Publication (Kokoku) No. S63-56121 and FIGS. 10 and 11 of the present application show rails which have C-shaped and reverse-C-shaped guide sections; and the rails with guide sections whose upper surfaces are open are shown in Japanese Patent Application Laid-Open (Kokai) No. S55-26696.

The first and second embodiments are described with reference to the rails which have angled C-shaped ("[") and angled reverse-C-shaped ("]") guide sections, and protruding sections 22a which extend toward the upper surface of the lead frame 1 are formed on the edge surface guide rail elements 22.

However, in the third and fourth embodiments shown in FIGS. 6 and 7, frame rails 21 in which the upper surfaces of the guide sections are open are used; and thus these embodiments include no protruding sections 22a. As seen from FIGS. 6 and 7, the lead frame 1 contacts the frame rails 21 with its end surface(s). The same effect as those described with reference to the first and second embodiments is obtained by the third and fourth embodiments. Thus, it is clear that the present invention is applicable to rails which have the open guide sections.

Figure 8:
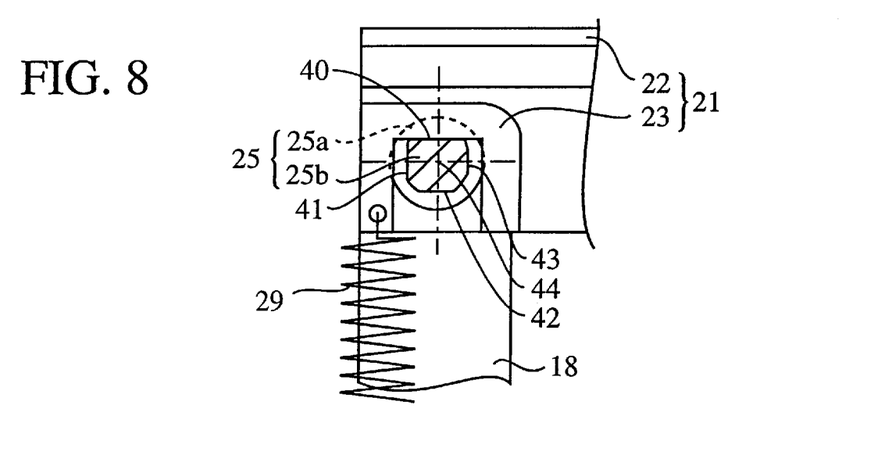
FIG. 8 shows the essential portion of the fifth embodiment of the present invention, showing the cam portion viewed in the same way as shown in FIGS. 3 and 5.

FIG. 8 illustrates the fifth embodiment of the present invention.

Though in the respective embodiments described above the cam portions 25b are formed as eccentric shafts, the cam portions 25b of the fifth embodiment is formed with flat external circumferential surfaces 40, 41, 42 and 43. The distance of each one of the flat surfaces 40, 41, 42 and 43 from the center 44 is set to be different from each other according to the type (thickness) of workpiece to be handled. Since these flat surfaces function as in the same manner as the eccentric shaft, the same effect as those described in the first through fourth embodiments is obtained by this fifth embodiment.

In the shown embodiment, four flat surfaces 40, 41, 42 are 43 are provided in the cam portion 25b; however, there is no restriction on the number of flat surfaces. As in the case of FIGS. 4 and 5, it goes without saying, though, that differences in the thickness of the lead frames are limited to the number of flat surfaces.

In the embodiments shown in FIGS. 1 through 3 and FIG. 6, the rotational shafts 25 which have cam portions 25b, and the motors 26, which effected rotational driving of the rotational shafts 25, form an undersurface guide rail element driving means which raises and lowers the undersurface guide rail elements 23. However, it is also possible to install the undersurface guide rail elements 23 on the guide rail stands 18 so that the undersurface guide rail elements 23 are movable in a vertical direction and move the undersurface guide rail elements 23 up and down from below by means of motors, air-cylinders, etc.

As seen from the above, according to the present invention for a guide rail mechanism, each of the frame guide rails comprises an edge surface guide rail element, which is fastened to a guide rail stand and guides the edge surface of a lead frame, and an undersurface guide rail element, which is provided beneath the edge surface guide rail element and supports the undersurface of the edge portion of the lead frame; and an undersurface guide rail element driving means is provided so as to raise and lower the undersurface guide rail elements. Accordingly, adjustment of the height of the frame guide rails in accordance with changes in the type (thickness) of lead frames can be accomplished in a short time, thus improving the productivity. In addition, the cost required for each change in the type of workpiece can be reduced.

What is claimed is:

1. A guide rail mechanism for a bonding apparatus equipped with a pair of guide rails that guide a workpiece, wherein each of said guide rails consists of:

an edge surface guide rail element which is provided on a guide rail stand and guides an edge surface of said workpiece, and an undersurface guide rail element which is disposed beneath said edge surface guide rail element and supports an undersurface of an edge portion of said workpiece; and said mechanism further comprises an undersurface guide rail element driving means which raises and lowers said undersurface guide rail element.

2. A guide rail mechanism for a bonding apparatus according to claim 1, wherein said undersurface guide rail element driving means comprises:

a rotational shaft consisting of a shaft portion, which is rotatably installed in said guide rail stand, and a cam portion, which is provided at one end of said shaft portion and supports, raises and lowers said undersurface guide rail element; and a rotational driving means which rotates said rotational shaft.

3. A guide rail mechanism for a bonding apparatus according to claim 1, wherein said undersurface guide rail element driving means comprises:

a rotational shaft consisting of a shaft portion, which is rotatably installed in said guide rail stand, and a cam portion, which is provided at one end of said shaft portion and supports, raises and lowers said undersurface guide rail element;

a rotational driving means which rotates said rotational shaft; and a control device which controls an amount of driving of said rotational driving means.

4. A guide rail mechanism for a bonding apparatus according to claim 1, wherein said undersurface guide rail element driving means comprises:

a rotational shaft consisting of a shaft portion, which is rotatably installed in said guide rail stand, and a cam portion, which is provided at one end of said shaft portion and supports, raises and lowers said undersurface guide rail element; and a rotational shaft positioning means which holds said rotational shaft in a plurality of stopping positions.

5. A guide rail mechanism for a bonding apparatus equipped with a pair of guide rails that guide a workpiece, wherein each of said guide rails consists of:

an edge surface guide rail element which is provided on a guide rail stand and guides an edge surface of said workpiece, a top of a guide section thereof being open, and an undersurface guide rail element which is disposed beneath said edge surface guide rail element and supports an undersurface of an edge portion of said workpiece; and said mechanism further comprises an undersurface guide rail element driving means which raises and lowers said undersurface guide rail element.

6. A guide rail mechanism for a bonding apparatus comprising:

a pair of guide rails for guiding a workpiece to be conveyed, each of said pair of guide rails consisting of an edge surface guide rail element, which is provided on a guide rail stand and guides an edge surface of said workpiece, and an undersurface guide rail element, which is disposed beneath said edge surface guide rail element and supports an undersurface of an edge portion of said workpiece; and an undersurface guide rail element driving means which moves said undersurface guide rail element toward and away from said edge surface guide rail element so as to change a distance between said edge surface guide rail element and said undersurface guide rail element for workpieces of different thicknesses.

* * * * *